(12) United States Patent
Morinaga (10) Patent No.: US 11,063,568 B2
(45) Date of Patent: Jul. 13, 2021

(54) RESONANCE DEVICE MANUFACTURING METHOD

(71) Applicant: Murata Manufacturing Co., Ltd., Nagaokakyo (JP)

(72) Inventor: Shungo Morinaga, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 334 days.

(21) Appl. No.: 16/192,842

(22) Filed: Nov. 16, 2018

(65) Prior Publication Data

US 2019/0089321 A1    Mar. 21, 2019

Related U.S. Application Data

(63) Continuation of application No. PCT/JP2017/002299, filed on Jan. 24, 2017.

(30) Foreign Application Priority Data

Jun. 8, 2016 (JP) .............................. JP2016-114662

(51) Int. Cl.
*H03H 3/04* (2006.01)
*H03H 3/007* (2006.01)
(Continued)

(52) U.S. Cl.
CPC ............ *H03H 3/04* (2013.01); *H03H 3/0077* (2013.01); *H03H 9/1014* (2013.01);
(Continued)

(58) Field of Classification Search
CPC .......... H03H 3/04; H03H 9/21; H03H 9/1014; H03H 2009/155; H03H 3/0077;
(Continued)

(56) References Cited

U.S. PATENT DOCUMENTS 6,541,897 B2* 4/2003 Endoh .................. H03H 9/1021
310/340
10,374,569 B2* 8/2019 Umeda ................ H03H 9/2489
(Continued)

FOREIGN PATENT DOCUMENTS

JP    2012070419 A    4/2012
JP    2013126104 A    6/2013
(Continued)

OTHER PUBLICATIONS

International Search Report issued for PCT/JP2017/002299 dated Apr. 18, 2017.
(Continued)

*Primary Examiner* — Peter Dungba Vo
*Assistant Examiner* — Kaying Kue
(74) *Attorney, Agent, or Firm* — Arent Fox LLP (57) ABSTRACT

A method for adjusting a resonant frequency of a resonator without impairing piezoelectricity that includes preparing a lower lid; arranging a substrate with a lower surface that faces the lower lid and forming a first electrode layer, a piezoelectric film, and a second electrode layer on an upper surface of the substrate. Moreover, a vibration arm is formed that bends and vibrates from the first electrode layer, the second electrode layer, and the piezoelectric film and an upper lid faces the lower lid with the resonator interposed therebetween. The method further includes adjusting a frequency of the resonator before or after arranging the upper lid by exciting the vibration arm by applying a voltage between the first electrode layer and the second electrode layer and by causing a part of the vibration arm to collide with either or both of the lower lid and the upper lid.

5 Claims, 8 Drawing Sheets (51) Int. Cl.
*H03H 9/24* (2006.01)
*H03H 9/10* (2006.01)
*H03H 9/21* (2006.01)
*H03H 3/02* (2006.01)
*H03H 9/15* (2006.01)

(52) U.S. Cl.
CPC ............ *H03H 9/1057* (2013.01); *H03H 9/21* (2013.01); *H03H 9/2489* (2013.01); *H03H 2003/026* (2013.01); *H03H 2003/027* (2013.01); *H03H 2003/0492* (2013.01); *H03H 2009/155* (2013.01)

(58) Field of Classification Search
CPC ............... H03H 9/2489; H03H 9/1057; H03H 2003/026; H03H 2003/027; H03H 2003/0492
USPC ................ 29/25.35, 7.01, 602.1, 592.1, 600; 310/370, 344, 348, 321; 333/189, 202
See application file for complete search history.

(56) References Cited

U.S. PATENT DOCUMENTS

| | | | |
|---|---|---|---|
| 10,749,496 B2* | 8/2020 | Yoshii | H03H 3/0077 |
| 2001/0022488 A1 | 9/2001 | Kawauchi et al. | |
| 2012/0038244 A1* | 2/2012 | Wada | H03H 3/10 |
| | | | 310/313 C |
| 2012/0293048 A1* | 11/2012 | Ueno | H03H 9/1021 |
| | | | 310/344 |

FOREIGN PATENT DOCUMENTS

| | | |
|---|---|---|
| JP | 2014175809 A | 9/2014 |
| JP | 2015167305 A | 9/2015 |
| WO | 2011043357 A1 | 4/2011 |

OTHER PUBLICATIONS

Written Opinion of the International Searching Authority issued for PCT/JP2017/002299 dated Apr. 18, 2017.

* cited by examiner

RESONANCE DEVICE MANUFACTURING METHOD

CROSS REFERENCE TO RELATED APPLICATIONS

The present application is a continuation of PCT/JP2017/002299 filed Jan. 24, 2017, which claims priority to Japanese Patent Application No. 2016-114662, filed Jun. 8, 2016, the entire contents of each of which are incorporated herein by reference.

TECHNICAL FIELD

The present disclosure relates to a resonance device manufacturing method.

BACKGROUND

Resonance devices using MEMS (Micro Electro Mechanical Systems) technology are currently used as timing devices, for example. These resonance devices are typically mounted on a printed circuit board incorporated in an electronic device such as a smartphone. The resonance device includes a lower side substrate, an upper side substrate that forms a cavity between the lower side substrate and the upper side substrate, and a resonator that is arranged in the cavity between the lower side substrate and the upper side substrate.

For example, Patent Document 1 (identified below) discloses a laser irradiation method in which, while minimizing damage to a silicon material and surrounding constituent elements, with a laser which is transmitted through the silicon material, a target object behind the silicon material can be irradiated, and a frequency adjustment method of a piezoelectric vibrator using the laser irradiation method. In the method disclosed in Patent Document 1, by irradiating a silicon material region of a package of an electronic component with a pulse laser having a pulse width of 50 to 1000 fs and transmitting the pulse laser therethrough, and by irradiating the piezoelectric vibrator with the transmitted laser, a resonant frequency of the piezoelectric vibrator is adjusted.

Patent Document 1: International Publication No. 2011/043357.

In the conventional frequency adjustment method as disclosed in Patent Document 1, a resonator is exposed to high heat when irradiated with a laser, thereby deteriorating piezoelectricity.

SUMMARY OF THE INVENTION

The present disclosure has been made in view of such circumstances. It is an object of the exemplary embodiments of the present disclosure to adjust a resonant frequency without impairing piezoelectricity of a resonator.

Thus, a resonance device manufacturing method according an exemplary aspect is disclosed that includes preparing a lower lid; arranging a substrate such that a lower surface of the substrate faces the lower lid and forming a first electrode layer, a piezoelectric film, and a second electrode layer on an upper surface of the substrate in order; forming a resonator that includes vibration arm configured to bends and vibrate from the first electrode layer, the second electrode layer, and the piezoelectric film; and arranging an upper lid so as to face the lower lid with the resonator interposed therebetween. Moreover, the method further including adjusting a frequency of the resonator before or after the arranging the upper lid by exciting the vibration arm by applying a voltage between the first electrode layer and the second electrode layer and by causing a part of the vibration arm to collide with at least one of the lower lid and the upper lid.

According to the exemplary aspects of the present disclosure, it is possible to adjust a resonant frequency without impairing piezoelectricity of a resonator.

DETAILED DESCRIPTION OF EMBODIMENTS

Exemplary Embodiment

Figure 1:
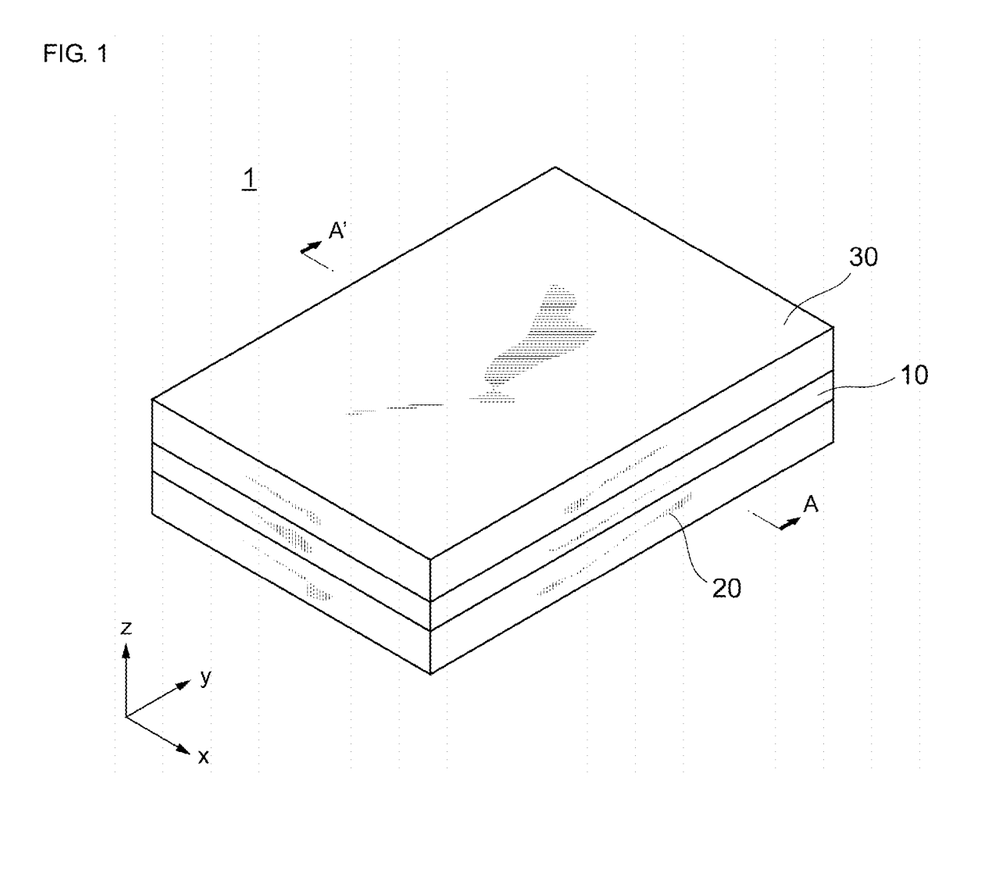
FIG. 1 is a perspective view schematically illustrating an external appearance of a resonance device according to an exemplary embodiment.
Figure 2:
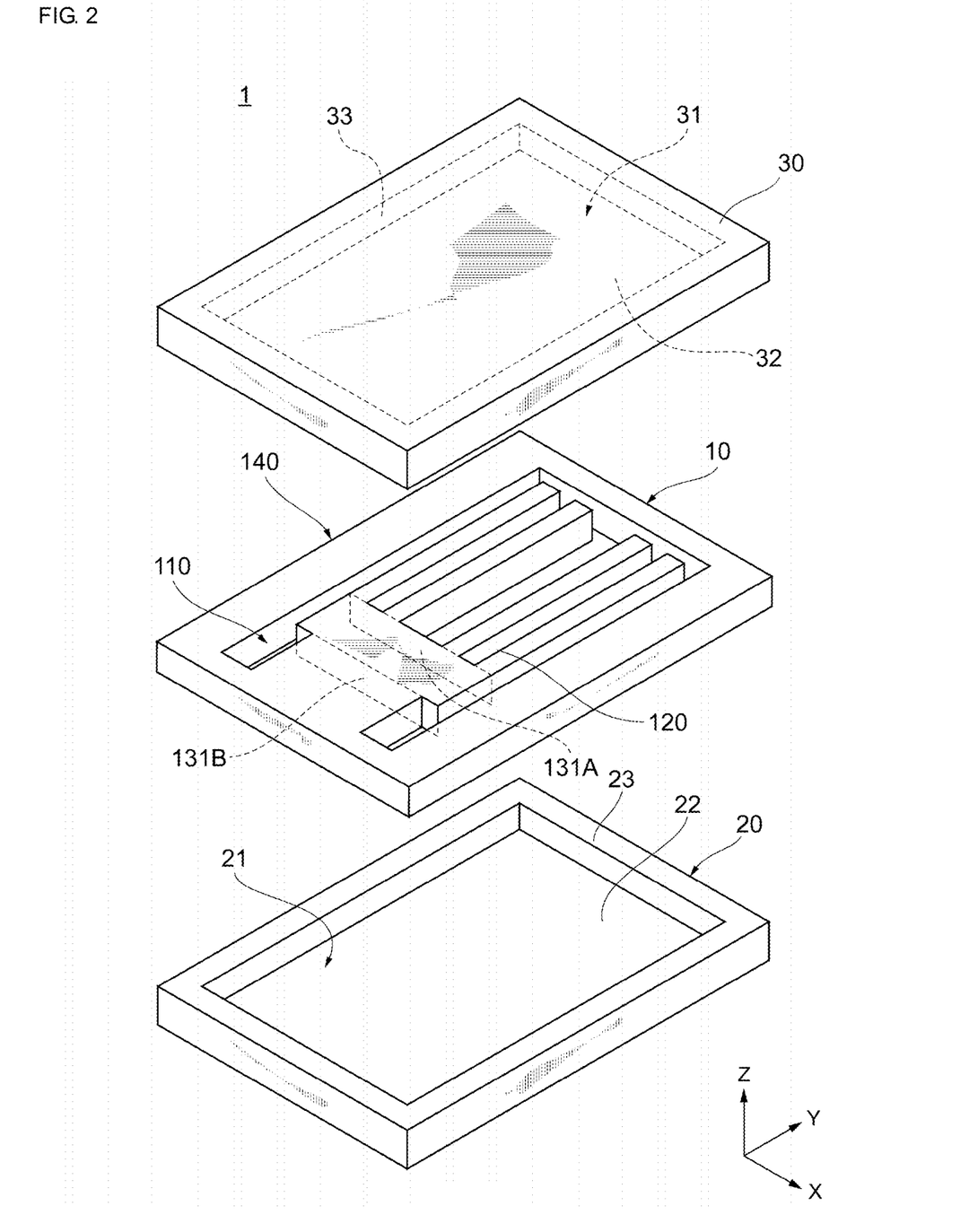
FIG. 2 is an exploded perspective view schematically illustrating a configuration of the resonance device according to the exemplary embodiment.

Hereinafter, an exemplary embodiment will be described with reference to the accompanying drawings. FIG. 1 is a perspective view schematically illustrating an external appearance of a resonance device 1 according to a first exemplary embodiment. FIG. 2 is an exploded perspective view schematically illustrating a configuration of the resonance device 1 according to the first exemplary embodiment.

The resonance device 1 includes a resonator 10 and a lid body (an upper lid 30 and a lower lid 20) provided so as to face each other with the resonator 10 interposed therebetween. In other words, the resonance device 1 is configured of the lower lid 20, the resonator 10, and the upper lid 30 laminated in this order.

Further, the resonator 10 is bonded to the lower lid 20 and the upper lid 30, whereby the resonator 10 is sealed and a vibration space of the resonator 10 is formed. The resonator 10, the lower lid 20 and the upper lid 30 are each formed using an Si substrate. Additionally, the resonator 10, the lower lid 20 and the upper lid 30 are bonded together by bonding the Si substrates to one another. The resonator 10 and the lower lid 20 may each be formed using an SOI substrate.

According to the exemplary aspect, the resonator 10 is an MEMS resonator manufactured using an MEMS technology. It is noted that the present embodiment describes the resonator 10 which is formed using a silicon substrate as an example. Hereinafter, each configuration of the resonance device 1 will be described in detail.

Upper Lid 30

As shown, the upper lid 30 has a bottom plate 32 having a rectangular plate shape provided along an XY plane, and a side wall 33 extending from a peripheral edge portion of the bottom plate 32 in a Z-axis direction (that is, in the lamination direction of the upper lid 30 and the resonator 10). On a surface of the upper lid 30 facing the resonator 10, a recessed portion 31 formed by a surface of the bottom plate 32 and an inner surface of the side wall 33 is provided. The recessed portion 31 forms a part of the vibration space which is a space in which the resonator 10 vibrates.

Lower Lid 20

Moreover, the lower lid 20 has a bottom plate 22 having a rectangular plate shape provided along the XY plane, and a side wall 23 extending from a peripheral edge portion of the bottom plate 22 in the Z-axis direction (that is, in the lamination direction of the lower lid 20 and the resonator 10). On a surface of the lower lid 20 facing the resonator 10, a recessed portion 21 formed by a surface of the bottom plate 22 and an inner surface of the side wall 23 is provided. The recessed portion 21 forms a part of the vibration space of the resonator 10. By the above-described upper lid 30 and lower lid 20, this vibration space is hermetically sealed and is maintained in a vacuum state. The vibration space may be filled with gas such as inert gas, for example.

Resonator 10

Figure 3:
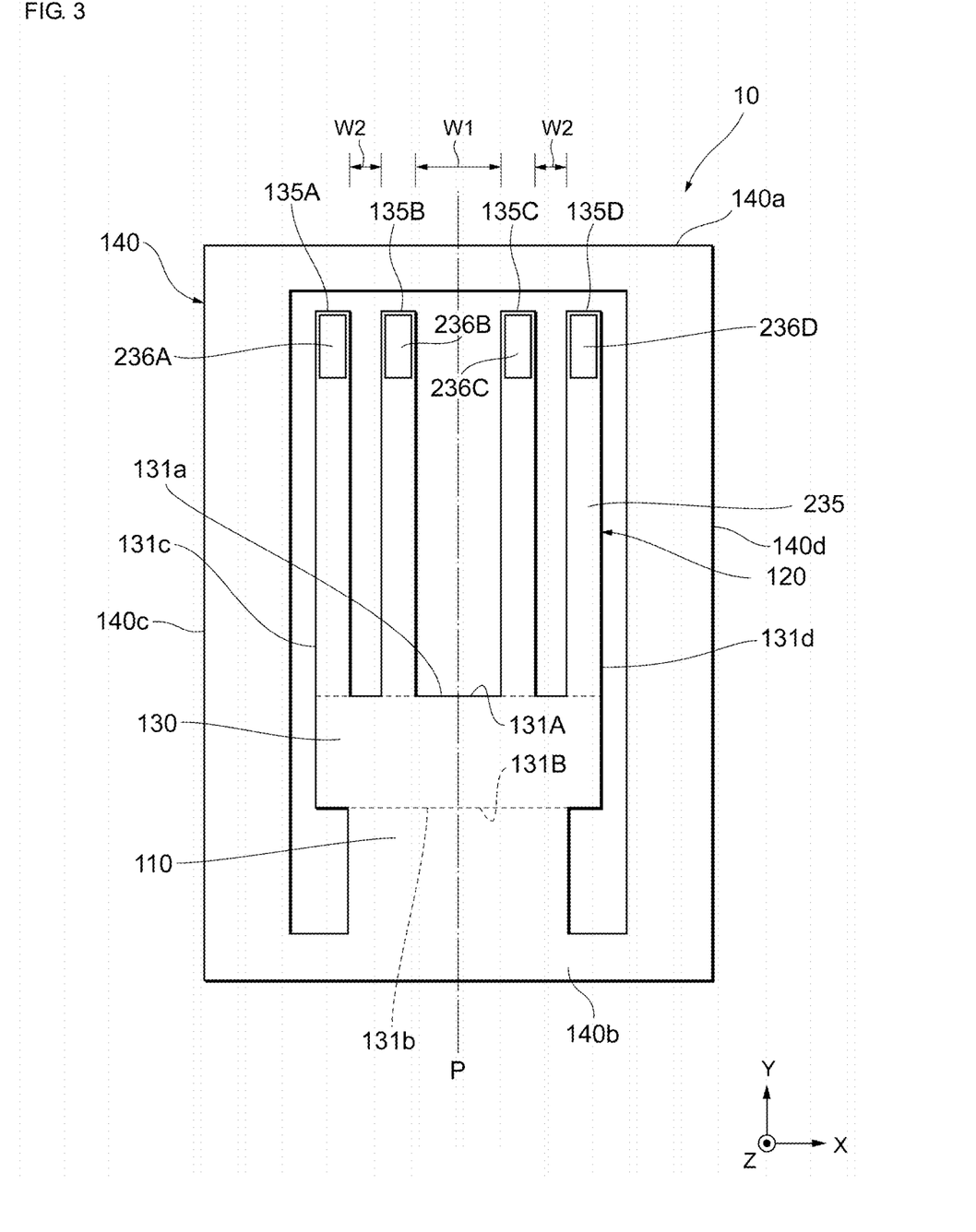
FIG. 3 is a plan view of a resonator whose upper side substrate is removed according to a first exemplary embodiment.

FIG. 3 is a plan view schematically illustrating a configuration of the resonator 10 according to the present embodiment. Each configuration of the resonator 10 according to the present embodiment will be described with reference to FIG. 3. The resonator 10 includes a vibration portion 120, a holding portion 140 (i.e., a frame), and a holding arm 110.

Vibration Portion 120

The vibration portion 120 has a rectangular contour extending along the XY plane in an orthogonal coordinate system of FIG. 3. The vibration portion 120 is provided in an inner side portion of the holding portion 140, and a space is formed between the vibration portion 120 and the holding portion 140 at a predetermined interval. In the example of FIG. 3, the vibration portion 120 includes a base portion 130 (i.e., a base) and four vibration arms 135A to 135D (also collectively referred to as "vibration arms 135"). It is noted that the number of vibration arms is not limited to four, and is set to an arbitrary number of, for example, one or more. In the present embodiment, the respective vibration arms 135 and the base portion 130 are integrally formed.

In a plan view, the base portion 130 has long sides 131a and 131b in an X-axis direction and short sides 131c and 131d in a Y-axis direction. The long side 131a is a side of a front end surface 131A of the base portion 130 (hereinafter, also referred to as a "front end 131A"), and the long side 131b is a side of a rear end surface 131B of the base portion 130 (hereinafter, also referred to as a "rear end 131B"). At the base portion 130, the front end 131A and the rear end 131B are provided so as to face each other.

The base portion 130 is connected to the vibration arms 135, which will be described later, at the front end 131A, and is connected to the holding arm 110, which will be described later, at the rear end 131B. It is noted that in the example of FIG. 3, the base portion 130 has a substantially rectangular shape in a plan view, but is not limited thereto, and it is sufficient to be substantially symmetrically formed with respect to an imaginary plane P defined along a perpendicular bisector of the long side 131a. For example, the base portion 130 may have a trapezoidal shape in which the long side 131b is shorter than the long side 131a, or a semicircular shape having the long side 131a as a diameter. Further, the long sides 131a and 131b and the short sides 131c and 131d are not limited to straight lines, and may be curved lines.

In the base portion 130, a base portion length (a length of each of the short sides 131c and 131d in FIG. 3) which is the longest distance between the front end 131A and the rear end 131B in a direction from the front end 131A toward the rear end 131B is approximately 40 µm. In addition, a base portion width (a length of each of the long sides 131a and 131b in FIG. 3) which is the longest distance between the side ends of the base portion 130 in the width direction orthogonal to a base portion length direction is approximately 300 µm.

The vibration arms 135 extend in the Y-axis direction and have the same size. Each of the vibration arms 135 is provided between the base portion 130 and the holding portion 140 in parallel to the Y-axis direction, and one end thereof is connected to the front end 131A of the base portion 130 and serves as a fixed end, and the other end is an open end. Further, the vibration arms 135 are provided in parallel at predetermined intervals in the X-axis direction. In an exemplary aspect, the vibration arms 135 each have a width of approximately 50 µm in the X-axis direction and a length of approximately 450 µm in the Y-axis direction, for example.

In the vibration portion 120 of the present embodiment, in the X-axis direction, two vibration arms 135A and 135D are disposed in an outer side portion, and two vibration arms 135B and 135C are disposed in an inner side portion. An interval W1 between the vibration arms 135B and 135C in the X-axis direction is set to be larger than an interval W2 between the vibration arm 135A (135D) in the outer side portion in the X-axis direction and the vibration arm 135B (135C) in the inner side portion adjacent to the vibration arm 135A (135D) in the outer side portion. The interval W1 is, for example, approximately 25 µm, and the interval W2 is, for example, approximately 10 µm. By setting the interval W2 smaller than the interval W1, the vibration characteristics are improved. Further, the interval W1 may be set smaller than the interval W2 or may be disposed at equal intervals so that the resonance device 1 can be reduced in size.

A protective film 235 (an example of a first adjustment film) is formed so as to cover the entire surface of the vibration portion 120 (a surface facing the upper lid 30). Further, on surfaces of the protective film 235 at tips of the vibration arms 135A to 135D on the open end side, adjustment films 236A to 236D (an example of a second adjustment film. Hereinafter, the adjustment films 236A to 236D are also collectively referred to as "adjustment films 236") are formed, respectively. Using the protective film 235 and the adjustment film 236, the resonant frequency of the vibration portion 120 can be adjusted.

Specifically, the adjustment film 236 is formed so as to expose a surface thereof in a region in which displacement due to vibration is relatively large in the vibration portion 120. Specifically, the adjustment film 236 is formed on the tip of each of the vibration arms 135 (an example of a second region). On the other hand, a surface of the protective film 235 is exposed on the other region of each of the vibration arms 135 (an example of a first region).

Figure 4:
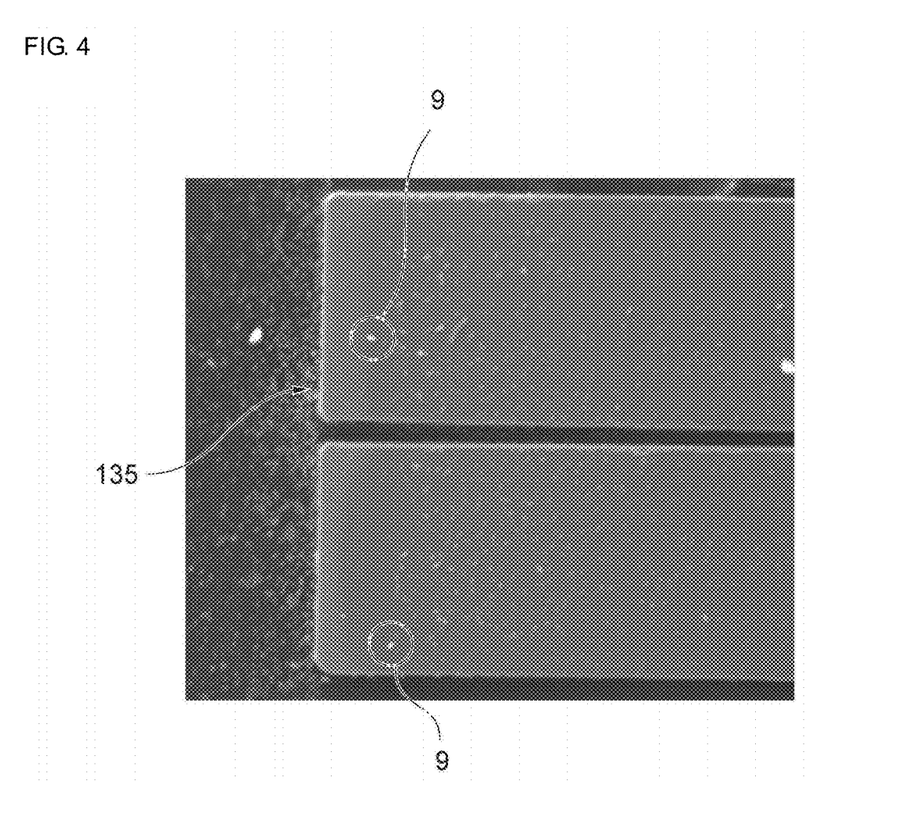
FIG. 4 is a photograph showing a state of a tip of a vibration arm according to the exemplary embodiment.

FIG. 4 is a photograph showing a state of a rear side of the tip of the vibration arm 135 (facing the lower lid 20) according to the present embodiment. As shown in FIG. 4, particles 9 having a diameter of approximately 1 μm adhere to the rear surface of the vibration arm 135. The particles 9 are parts of the vibration arm 135, the upper lid 30 and the lower lid 20 being scrapped off in a frequency adjustment step described later. In addition, a corner portion of the adjustment film 236 is rounded by the frequency adjustment step and has an R shape.

(b) Holding Portion 140

Referring back to FIG. 3, the rest of the configuration of the resonator 10 will be described.

The holding portion 140 (which can be considered a frame) is formed in a rectangular frame-like shape along the XY plane. In a plan view, the holding portion 140 is provided so as to surround an outer side portion of the vibration portion 120 along the XY plane. It is sufficient that the holding portion 140 is provided at least at a part of the periphery of the vibration portion 120, and the shape is not limited to the frame-like shape. For example, it is sufficient that the holding portion 140 is provided around the vibration portion 120 to such an extent as to be capable of holding the vibration portion 120 and being bonded to the upper lid 30 and the lower lid 20.

In the present embodiment, the holding portion 140 includes prism-shaped frame bodies 140a to 140d which are integrally formed. As illustrated in FIG. 3, the frame body 140a is provided, while facing the open end of the vibration arm 135, such that the longitudinal direction thereof is parallel to the X-axis. The frame body 140b is provided, while facing the rear end 131B of the base portion 130, such that the longitudinal direction thereof is parallel to the X-axis. The frame body 140c is provided, while facing the side end of the base portion 130 (short side 131c) and the vibration arm 135A, such that the longitudinal direction thereof is parallel to the Y-axis, and both ends thereof are connected to one ends of the frame bodies 140a and 140b, respectively. The frame body 140d is provided, while facing the side end of the base portion 130 (short side 131d) and the vibration arm 135D, such that the longitudinal direction thereof is parallel to the Y-axis, and both ends thereof are connected to the other ends of the frame bodies 140a and 140b, respectively.

In the present embodiment, the holding portion 140 is described as being covered with the protective film 235, but is not limited thereto, and the protective film 235 may not be formed on the surface of the holding portion 140.

(c) Holding Arm 110

The holding arm 110 is provided in an inner side portion of the holding portion 140 and connects the long side 131b of the base portion 130 and the frame body 140b. It is noted that the configuration is not limited thereto, and for example, the configuration may be such that the holding arm 110 is formed by a plurality of arms (for example, two arms) each having a bent portion, and connects the rear end 131B of the base portion 130 and the frame bodies 140c and 140d of the holding portion 140.

Lamination Structure

Figure 5:
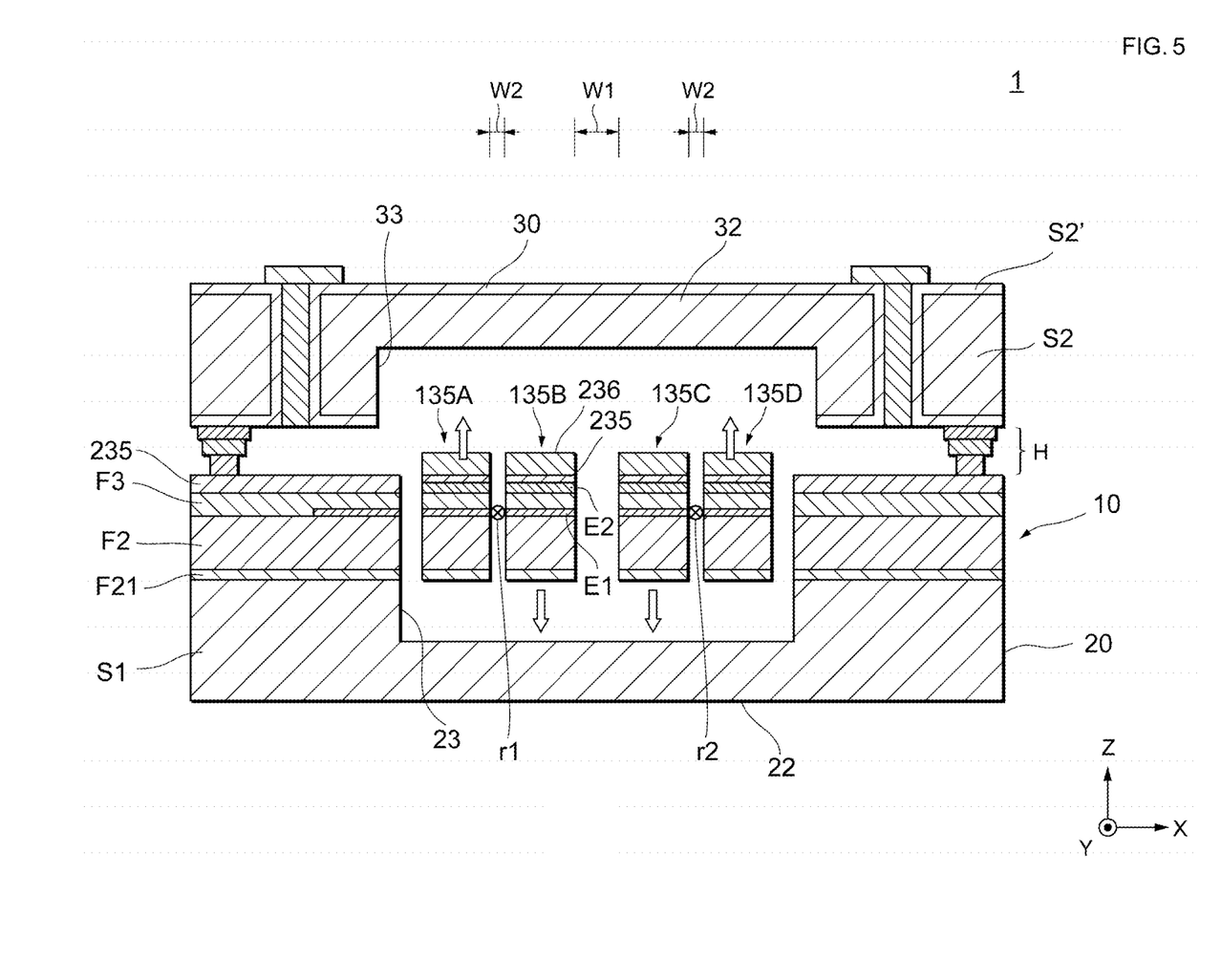
FIG. 5 is a cross-sectional view taken along a line A-A' in FIG. 1.

A lamination structure of the resonance device 1 will be described with reference to FIG. 5. FIG. 5 is a cross-sectional view taken along a line A-A' in FIG. 1. As illustrated in FIG. 5, in the resonance device 1 according to the present embodiment, the holding portion 140 of the resonator 10 is bonded on the side wall 23 of the lower lid 20, and furthermore, the holding portion 140 of the resonator 10 and the side wall 33 of the upper lid 30 are bonded together. As described above, the resonator 10 is held between the lower lid 20 and the upper lid 30, and the vibration space in which the vibration arm 135 vibrates is formed by the lower lid 20, the upper lid 30, and the holding portion 140 of the resonator 10.

The bottom plate 22 and the side wall 23 of the lower lid 20 are integrally formed of an Si (silicon) wafer S1. Further, the lower lid 20 is bonded to the holding portion 140 of the resonator 10 by an upper surface of the side wall 23. The Si wafer S1 is formed of silicon which is not degenerated, and has a resistivity of, for example, equal to or higher than 1 kΩ·cm.

In the lower lid 20, the bottom plate 22 thereof is provided at a position where displacement of the vibration arm 135 due to the vibration is maximized. In the present embodiment, the thickness of the lower lid 20 defined in the Z-axis direction is, for example, 150 μm, and the depth of the recessed portion 21 is, for example, 50 μm.

The upper lid 30 is formed of an Si (silicon) wafer S2 having a predetermined thickness. As illustrated in FIG. 5, the upper lid 30 is bonded to the holding portion 140 of the resonator 10 at a peripheral portion thereof (side wall 33). It is preferable that a surface and a rear surface facing the resonator 10 of the upper lid 30 be covered with a silicon oxide layer S2'. In addition, a configuration may be such that a getter layer (not shown) made of Ti (titanium) is formed on the surface of the upper lid 30 facing the resonator 10 inside the recessed portion 31. The getter layer is a layer for absorbing gas, by the getter action of titanium, in the vibration space formed by the upper lid 30 and the lower lid 20 and making the vibration space into a vacuum state.

In the upper lid 30, the bottom plate 32 thereof is provided at a position where the displacement of the vibration arm 135 due to the vibration is maximized. In the present embodiment, the thickness of the upper lid 30 defined in the Z-axis direction is, for example, 150 μm, and the depth of the recessed portion 31 is, for example, 50 μm.

A bonding portion H is formed between the side wall 33 of the upper lid 30 and the holding portion 140 to bond the upper lid 30 and the holding portion 140. The bonding portion H is, for example, formed of a metal film such as an Al (aluminum) film or a Ge (germanium) film. It is noted that the bonding portion H may be formed of an Au (gold) film and an Sn (tin) film.

In the resonator 10, the holding portion 140, the base portion 130, the vibration arm 135, and the holding arm 110 are integrally formed in the same process. In the resonator 10, first, on an Si (silicon) substrate F2 (an example of a substrate), a metal layer E1 (an example of a first electrode layer) is laminated. Additionally, a piezoelectric thin film F3 (an example of a piezoelectric film) is laminated on the metal layer E1 so as to cover the metal layer E1, and on the piezoelectric thin film F3, a metal layer E2 (an example of a second electrode layer) is further laminated. The protective film 235 is laminated on the metal layer E2 so as to cover the metal layer E2. On the vibration portion 120, the adjustment film 236 is further laminated on the protective film 235.

The Si substrate F2 is formed of, for example, a degenerate n-type Si semiconductor having a thickness of approximately 6 μm, and can include P (phosphorus), As (arsenic), Sb (antimony), or the like as an n-type dopant. A resistance value of the degenerate Si used for the Si substrate F2 is, for example, smaller than 16 mΩ·cm, and more preferably, equal to or smaller than 1.2 mΩ·cm. Further, on the lower surface of the Si substrate F2, a silicon oxide (for example, $SiO_2$) layer F21 (an example of a temperature characteristics correction layer) is formed. With this, the temperature characteristics can be improved. Further, at least one of the Si substrate F2 and the silicon oxide layer F21 is formed of a material having lower hardness than that of the bottom plate 22 of the lower lid 20. In the present specification, the hardness of each of the Si substrate F2, the silicon oxide layer F21, and the bottom plate 22 of the lower lid 20 is defined by the Vickers hardness, and it is preferable that the Vickers hardness of each of the Si substrate F2 and the silicon oxide layer F21 be equal to or lower than 10 GPa. On the other hand, the Vickers hardness of the bottom plate 22 of the lower lid 20 is preferably equal to or higher than 10 GPa.

In the present embodiment, the temperature characteristics correction layer is a layer having a function of reducing a temperature coefficient of a frequency (that is, a change rate per temperature) in the vibration portion at least in the vicinity of a normal temperature, when a temperature correction layer is formed on the Si substrate F2, in comparison with a case where the temperature characteristics correction layer is not formed on the Si substrate F2. By the vibration portion 120 having the temperature characteristics correction layer, for example, it is possible to reduce a change in the resonant frequency of the lamination structure body formed of the Si substrate F2, the metal layers E1 and E2, the piezoelectric thin film F3 and the silicon oxide layer (temperature correction layer) F21 caused by the temperature.

In the resonator 10, it is desirable that the silicon oxide layer F21 be formed with a uniform thickness. Note that the uniform thickness means that the variation in the thickness of the silicon oxide layer F21 is within ±20% of the average value of the thickness.

It is also noted that the silicon oxide layer F21 may be formed on the upper surface of the Si substrate F2 or on both the upper surface and the lower surface of the Si substrate F2. In addition, in the holding portion 140, the silicon oxide layer F21 may not be formed on the lower surface of the Si substrate F2.

The metal layers E2 and E1 are each formed, for example, using Mo (molybdenum), aluminum (Al), or the like having a thickness of approximately 0.1 to 0.2 μm. The metal layers E2 and E1 are each formed into a desired shape by etching or the like. The metal layer E1 is formed, for example, on the vibration portion 120, so as to function as a lower electrode (an example of the first electrode layer). Further, the metal layer E1 is formed on the holding arm 110 and the holding portion 140 so as to function as a wiring for connecting the lower electrode to an AC power source provided outside the resonator 10.

On the other hand, the metal layer E2 is formed, on the vibration portion 120, so as to function as an upper electrode (an example of the second electrode layer). Further, the metal layer E2 is formed on the holding arm 110 and the holding portion 140 so as to function as a wiring for connecting the upper electrode to a circuit provided outside the resonator 10.

According to an exemplary aspect, in the connection from the AC power source to the lower wiring or the upper wiring, a configuration in which an electrode is formed on an outer surface of the upper lid 30 and the electrode connects the circuit and the lower wiring or the upper wiring, or a configuration in which a via is formed in the upper lid 30, a wiring is provided by filling the inside of the via with a conductive material, and the wiring connects the AC power source and the lower wiring or the upper wiring may be used.

The piezoelectric thin film F3 is a thin film of a piezoelectric body which converts an applied voltage into the vibration, and for example, can contain a nitride such as AlN (aluminum nitride) or an oxide as its primary component. Specifically, the piezoelectric thin film F3 can be formed of ScAlN (scandium aluminum nitride). ScAlN is formed by replacing a part of aluminum in aluminum nitride with scandium. Further, although the piezoelectric thin film F3 has a thickness of, for example, 1 μm, it is also possible to use a thickness of approximately 0.2 μm to 2 μm.

The piezoelectric thin film F3 expands and contracts in an in-plane direction of the XY plane, that is, in the Y-axis direction, in accordance with an electric field applied to the piezoelectric thin film F3 by the metal layers E2 and E1. With the expansion and contraction of the piezoelectric thin film F3, the vibration arm 135 displaces the free end thereof toward the inner surfaces of the lower lid 20 and the upper lid 30, and vibrates in an out-of-plane bending vibration mode.

In the present embodiment, a phase of the electric field applied to the vibration arms 135A and 135D in the outer side portion and a phase of the electric field applied to the vibration arms 135B and 135C in the inner side portion are set to be reverse to each other. With this, the vibration arms 135A and 135D in the outer side portion and the vibration arms 135B and 135C in the inner side portion are displaced in reverse directions to each other. For example, when the vibration arms 135A and 135D in the outer side portion displace the free ends thereof toward the inner surface of the upper lid 30, the vibration arms 135B and 135C in the inner side portion displace the free ends thereof toward the inner surface of the lower lid 20.

According to the exemplary embodiment, the protective film 235 is formed of a material whose mass reduction rate of etching is lower than that of the adjustment film 236. For example, the protective film 235 is formed of a nitride film such as AlN or SiN, or an oxide film such as $Ta_2O_5$ (tantalum pentoxide) or $SiO_2$. Note that the mass reduction rate is expressed as the product of an etching rate (a thickness removed per unit time) and a density.

The adjustment film 236 is formed of a material whose mass reduction rate of etching is higher than that of the protective film 235. Further, the adjustment film 236 is made of a material with hardness which is at least equal to or lower than the hardness of the bottom plate 32 of the upper lid 30. The Vickers hardness of the adjustment film 236 is preferably equal to or lower than 2 GPa. On the other hand, the Vickers hardness of the bottom plate 32 is preferably equal to or higher than 10 GPa. Note that in a case where the upper lid 30 includes the getter layer, the adjustment film 236 has hardness of equal to or lower than that of the getter layer, for example, equal to or lower than 0.9 GPa.

For example, the adjustment film 236 is formed of a metal such as molybdenum (Mo), tungsten (W), gold (Au), platinum (Pt), or nickel (Ni).

Note that, as long as the relationship between the mass reduction rates of the protective film 235 and the adjustment film 236 is as described above, the etching rates thereof may be in any magnitude relationship.

The adjustment film 236 is formed, after being formed on substantially the entire surface of the vibration portion 120, only in a predetermined region by processing such as etching.

Etching of the protective film 235 and the adjustment film 236 is performed by, for example, simultaneously irradiating the protective film 235 and the adjustment film 236 with an ion beam (for example, an argon (Ar) ion beam). A wider range than the resonator 10 can be irradiated with the ion beam. Note that, although the present embodiment describes an example of etching using an ion beam, the etching method is not limited to using an ion beam.

In the resonance device 1 as described above, during the vibration with reverse phases, that is, around a center axis r1 extending in parallel to the Y-axis between the vibration arm 135A and the vibration arm 135B as illustrated in FIG. 5, the vibration arm 135A and the vibration arm 135B vibrate reversely to each other in the up-down direction. Further, around a center axis r2 extending in parallel to the Y-axis between the vibration arm 135C and the vibration arm 135D, the vibration arm 135C and the vibration arm 135D vibrate reversely to each other in the up-down direction. As a result, torsional moments in the reverse directions to each other are generated between the center axes r1 and r2, and bending vibrations occur in the base portion 130.

Process Flow

A manufacturing method for the resonance device 1 according to the present embodiment will be described with reference to FIG. 6A to FIG. 6H.

In the manufacturing method for the resonator 10 according to the present embodiment, in the frequency adjustment step described later, by causing the vibration arm 135 to be over-excited and collide with the upper lid 30 or the lower lid 20, a part of the vibration arm 135 (for example, the piezoelectric thin film F3, the adjustment film 236, the Si substrate F2, or the like) is scraped, and the weight of the vibration arm 135 is changed. With this, by increasing the resonant frequency of the resonator 10, the resonant frequency is adjusted to a desired value, and the resonance device 1 is manufactured.

FIG. 6A to FIG. 6H are diagrams illustrating an example of a process flow of the resonance device 1 according to the present embodiment. It should be appreciated that in FIG. 6A to FIG. 6H, although one resonance device 1 among a plurality of resonance devices 1 formed on a wafer will be illustrated and described for convenience, the resonance device 1 is obtained by a plurality of the resonance devices being formed on one wafer and then the wafer being divided, in the same manner as in a normal MEMS process as would be appreciated to one skilled in the art.

Figure 6A:
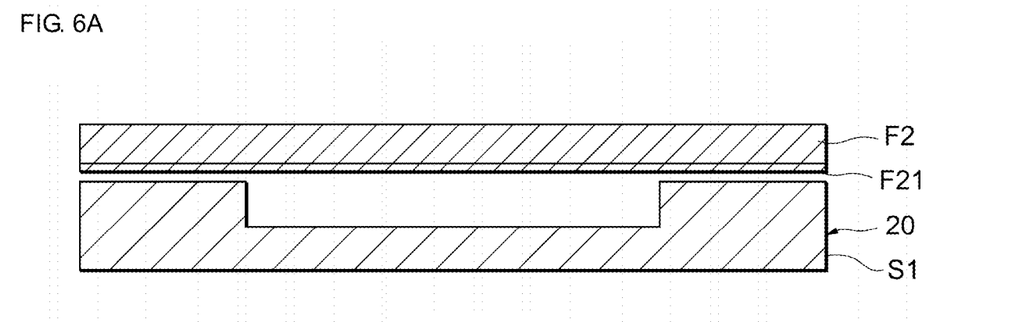
FIG. 6A is a diagram illustrating an example of a process flow of the resonance device according to the exemplary embodiment.

In a first step illustrated in FIG. 6A, the silicon oxide layer F21 is formed on the prepared Si substrate F2 by thermal oxidation. Next, the lower lid 20 having the recessed portion 21 is prepared, and the lower lid 20 and the Si substrate F2 on which the silicon oxide layer F21 is formed are disposed so that the lower surface of the Si substrate F2 faces the lower lid 20 and are bonded by the side wall 23. Note that although not illustrated in FIG. 6A, it is desirable to pla-narize the surface of the Si substrate F2 by a process such as chemical mechanical polishing or etching back after bonding.

Figure 6B:
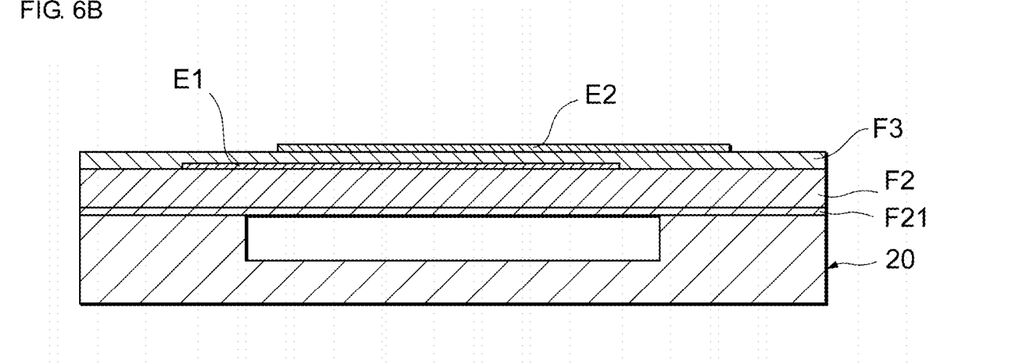
FIG. 6B is a diagram illustrating an example of the process flow of the resonance device according to the exemplary embodiment.

Next, in a step illustrated in FIG. 6B, the lower electrode or the like is further formed on the surface of the Si substrate F2 by film formation, patterning, etching, or the like of the metal layer E1 which is a material of the lower electrode or a wiring. Next, the piezoelectric thin film F3 is laminated on the surface of the metal layer E1, and the upper electrode or the like is further formed on the piezoelectric thin film F3 by film formation, patterning, etching, or the like of the metal layer E2 which is a material of the upper electrode or a wiring.

Figure 6C:
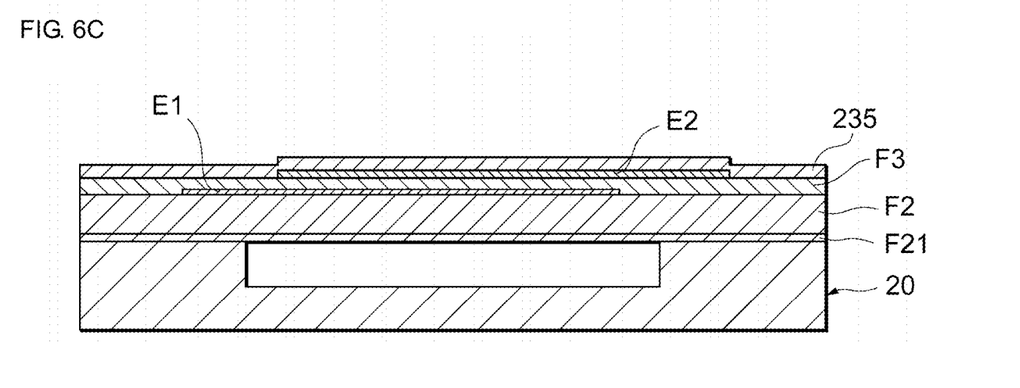
FIG. 6C is a diagram illustrating an example of the process flow of the resonance device according to the exemplary embodiment.

Next, in a step illustrated in FIG. 6C, the protective film 235 is laminated on the surface of the metal layer E2.

Figure 6D:
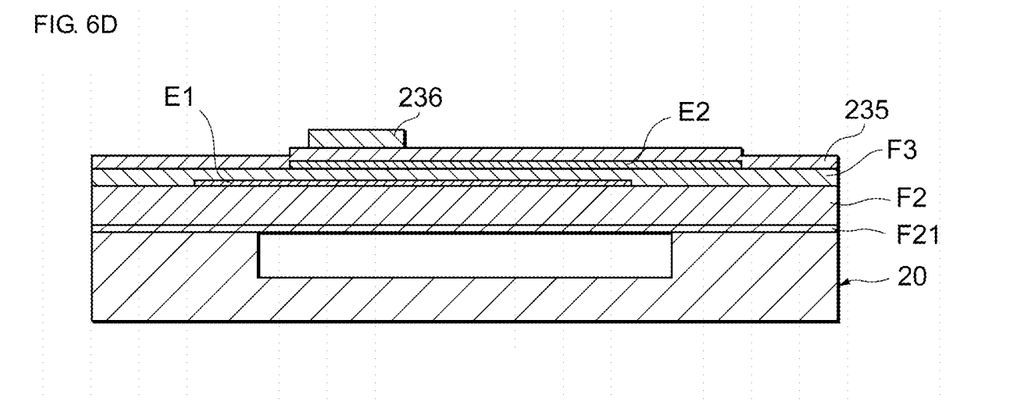
FIG. 6D is a diagram illustrating an example of the process flow of the resonance device according to the exemplary embodiment.
Figure 6E:
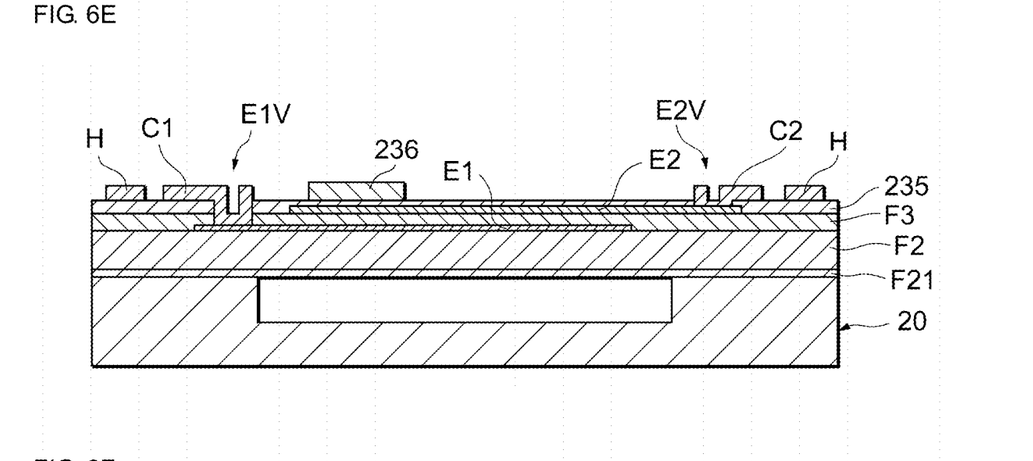
FIG. 6E is a diagram illustrating an example of the process flow of the resonance device according to the exemplary embodiment.
Figure 6F:
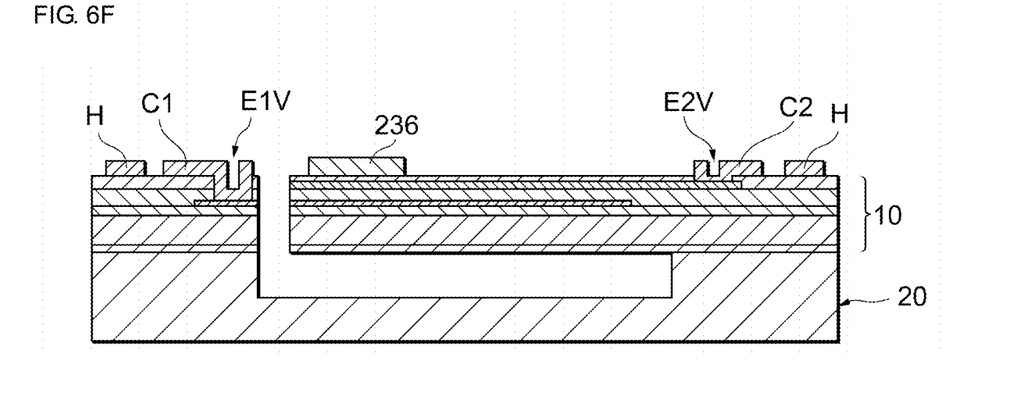
FIG. 6F is a diagram illustrating an example of the process flow of the resonance device according to the exemplary embodiment.

Next, in a step illustrated in FIG. 6D, a metal layer such as molybdenum is laminated on the surface of the protective film 235, and by the metal layer being processed by etching or the like, the adjustment film 236 is formed in the vicinity of a portion which becomes the free end of the vibration arm 135 (see FIG. 6F).

Next, in a step illustrated in FIG. 6E, vias E1V and E2V for respectively connecting the lower electrode and the upper electrode to the external power source are formed in the resonator 10. When the vias E1V and E2V are formed, the vias E1V and E2V are filled with a metal such as aluminum, and extended lines C1 and C2 that respectively extend the lower electrode and the upper electrode to the holding portion 140 are formed. Further, the bonding portion H is formed on the holding portion 140.

Next, in a step illustrated in FIG. 6F, the protective film 235, the metal layer E2, the piezoelectric thin film F3, the metal layer E1, the Si substrate F2, and the silicon oxide layer F21 are removed in order by processing such as etching, thereby forming the vibration portion 120 and the holding arm 110, and then forming the resonator 10.

After the resonator 10 is formed in the step illustrated in FIG. 6F, a trimming step for adjusting the film thickness of the adjustment film 236 is performed. By the trimming step, variation in frequency can be suppressed among the plurality of resonance devices 1 manufactured on the same wafer.

In the trimming step, first, a resonant frequency of each resonator 10 is measured, and a frequency distribution is calculated. Next, based on the calculated frequency distribution, the film thickness of the adjustment film 236 is adjusted. The adjustment of the film thickness of the adjustment film 236 can be performed by, for example, irradiating the entire surface of the resonance device 1 with an argon (Ar) ion beam and etching the adjustment film 236. Further, when the film thickness of the adjustment film 236 has been adjusted, it is desirable to wash the resonator 10 and remove the scattered film.

Figure 6G:
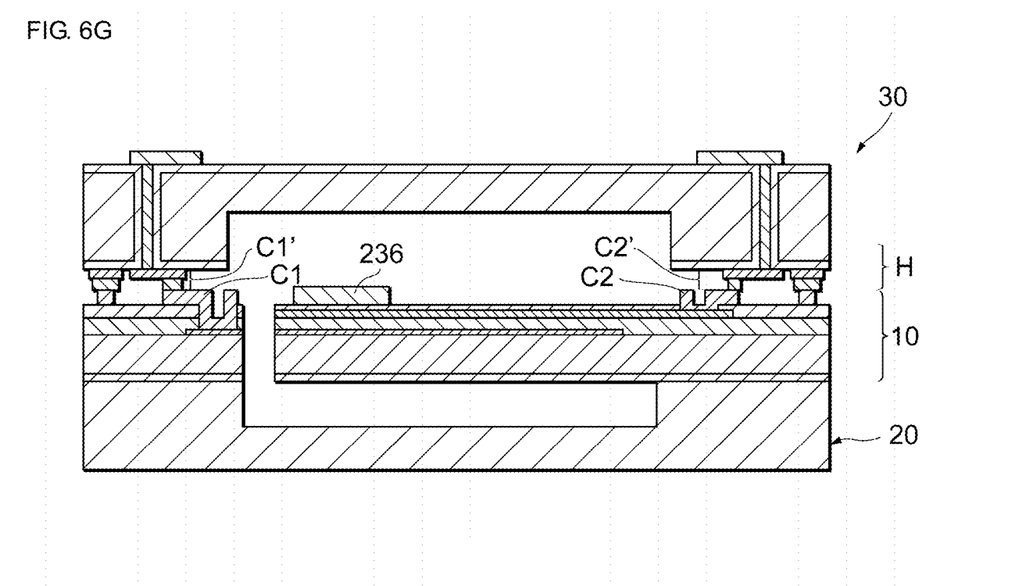
FIG. 6G is a diagram illustrating an example of the process flow of the resonance device according to the exemplary embodiment.

Next, in a step illustrated in FIG. 6G, a step of packaging the resonator 10 is performed. Specifically, in this step, the upper lid 30 and the lower lid 20 are faced to each other with the resonator 10 interposed therebetween. The upper lid 30, which is aligned such that the recessed portion 31 of the upper lid 30 and the recessed portion 21 of the lower lid 20 match with each other, is bonded to the lower lid 20 with the bonding portion H interposed therebetween. Further, electrodes C1' and C2' connected to the extended lines C1 and C2 are formed on the upper lid 30. The electrodes C1' and C2' are, for example, made of a metal layer such as aluminum or germanium. The metal layers E1 and E2 are connected to a circuit provided in the outside with the electrodes C1' and C2' interposed therebetween. When the lower lid 20 and the upper lid 30 are bonded to each other, the plurality of resonance devices 1 is formed by being cut with a dicing machine.

Figure 6H:
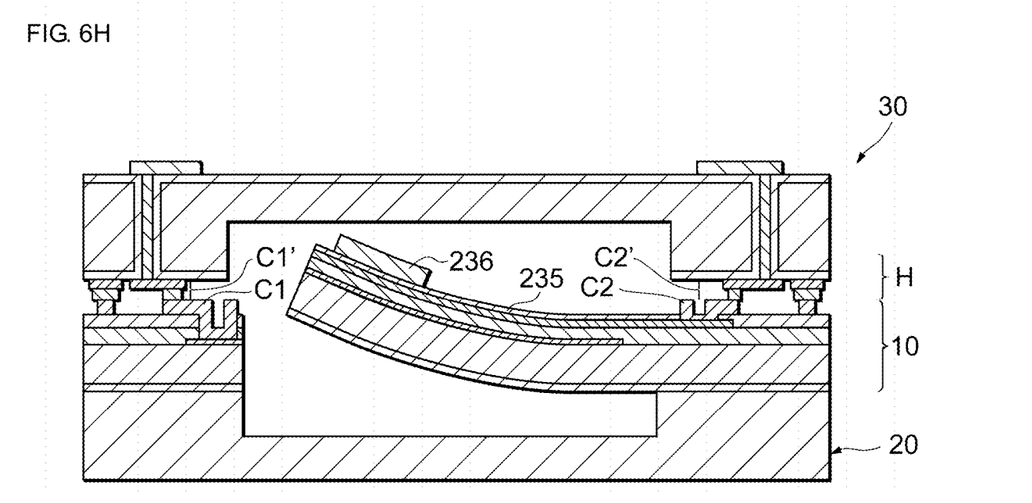
FIG. 6H is a diagram illustrating an example of the process flow of the resonance device according to the exemplary embodiment.

Next, in a step illustrated in FIG. 6H, the frequency adjustment step for further finely adjusting the resonant frequency is performed. In the frequency adjustment step, a resonant frequency is first measured in a state where a driving voltage of a predetermined value is applied to the resonator 10, and in a case where the resonant frequency is less than a desired value, a voltage larger than the driving voltage of the predetermined value is applied to the resonator 10 to over-excite the vibration arm 135. In the frequency adjustment step, power applied to the resonator 10 is, for example, equal to or larger than 0.2 μW. According to the exemplary aspect, the "over-excitation" means that the resonator 10 is vibrated with an amplitude equal to or more than 10 times a normal amplitude thereof, and specifically, an amplitude at the over-excitation is equal to or larger than 50 μm. Additionally, the desired value of the resonant frequency is, for example, approximately 32.767 to 32.769 kHz.

By over-exciting the vibration arm 135, the adjustment film 236 of the vibration arm 135 is caused (i.e., forced through the vibration) to collide with at least one of the bottom plate 32 (or the getter layer) of the upper lid 30 and the bottom plate 22 of the lower lid 20. Since the bottom plate 32 (or the getter layer) of the upper lid 30 is formed of a material having hardness equal to or higher than that of the adjustment film 236, the adjustment film 236 is scraped by the adjustment film 236 colliding with the bottom plate 32 (or the getter layer), and the weight of the vibration arm 135 decreases. Likewise, at least one of the Si substrate F2 and the silicon oxide layer F21 formed on a surface (rear surface) of the vibration arm 135 on the lower lid 20 side has hardness approximately equal to or lower than that of the bottom plate 22. Accordingly, the mass of the vibration arm 135 is reduced by the Si substrate F2 or the silicon oxide layer F21 being scraped off on the rear surface of the vibration arm 135 as well. With this, the resonant frequency of the resonator 10 increases.

After the resonator 10 is over-excited and caused to collide with at least one of the upper lid 30 and the lower lid 20, the driving voltage of the predetermined value is applied again to the resonator 10 and the resonant frequency is measured. It is possible to adjust the value of the resonant frequency to an appropriate value by repeatedly performing the measurement of the resonant frequency performed by applying the driving voltage of the predetermined value to the resonator 10 and the over-excitation of the resonator 10 by applying the voltage larger than the driving voltage to the resonator 10 until the resonant frequency reaches the desired value.

As described above, in the resonance device manufacturing method according to the present embodiment, by causing the vibration arm 135 to be over-excited to collide with the lower lid 20 and the upper lid 30, a part of the vibration arm 135 can be scraped off. With this, the resonant frequency can be adjusted even after the packaging. As a result, since there is no processing step in which a heat load or a stress load is applied after the frequency adjustment step, it is possible to prevent frequency variation from occurring. Further, since the adjustment can be performed while measuring the resonant frequency, the desired frequency can be obtained with ease.

Other Embodiments

Although the exemplary embodiment of the present disclosure has been described above, the present invention is not limited to the above-described embodiment, and various variations and changes can be made based on the technical idea of the present invention.

For example, in the above-described embodiment, although the configuration in which the vibration arm 135 includes the protective film 235 and the adjustment film 236 has been described, the configuration is not limited thereto. For example, the vibration arm 135 may be configured not to include the adjustment film 236 or both the protective film 235 and the adjustment film 236. In this case, the layer exposed on the surface of the vibration arm 135 (the metal layer E2 or the protective film 235) is formed of a material having low hardness equal to or lower than the hardness of the bottom plate 32. Specifically, aluminum or the like can be used as the material of the metal layer E2 in this case. Additionally, as the material of the protective film 235 in this case, a resin can be used. With this, in the frequency adjustment step described above, the layer (the metal layer E2, the protective film 235, or the like) exposed on the surface of the vibration arm 135 can be scraped off.

Further, in the above-described embodiment, although the configuration in which the bottom plate 22 of the lower lid 20 is a flat plate has been described, the configuration is not limited thereto. For example, the configuration may be such that, on the bottom plate 22 of the lower lid 20, a protrusion is provided at a position where the displacement due to the vibration of the vibration arm 135 is maximized.

In addition, in the above-described embodiment, although the configuration in which the frequency adjustment step is performed after the packaging step of the resonator 10 illustrated in FIG. 6G has been described, the configuration is not limited thereto. For example, the frequency adjustment step may be performed before the packaging step. In this case, the frequency adjustment step is preferably performed after the trimming step and before the packaging step of the resonator 10.

Further, in the above-described embodiment, although the configuration in which both the surface and the rear surface of the vibration arm 135 are scraped off in the frequency adjustment step has been described, the configuration is not limited thereto. For example, the vibration arm 135 may be configured to collide with either one of the lower lid 20 or the upper lid 30 during the over-excitation. In this case, it is preferable that at least the films, which are formed on the collision side, (the adjustment film 236, the protective film 235, and the metal layer E2 in the case of the surface side, both the Si substrate F2 and the silicon oxide layer F21 in the case of the rear surface side) each have hardness equal to or lower than that of the collision point of the vibration arm 135 (the getter layer 32, the bottom plate 32, or the bottom plate 22) in the lid on the collision side. Further, even in a case where the vibration arm 135 collides with both the lower lid 20 and the upper lid 30 during the over-excitation, a configuration may be such that the film formed on either the surface or the rear surface of the vibration arm 135 has the hardness higher than that of the lid on the collision side, and only one of the surfaces is scraped off in the frequency adjustment step.

Accordingly, the exemplary embodiments of the present disclosure have been described above. As disclosed, the exemplary resonance device manufacturing method includes preparing the lower lid 20; arranging the Si substrate F2 such that the lower surface of the Si substrate F2 faces the lower lid 20 and forming the metal layer E1, the piezoelectric thin film F3, and the metal layer E2 on the upper surface of the Si substrate F2 in order; forming the vibration arm 135 which bends and vibrates from the metal layer E1, the metal layer E2, and the piezoelectric thin film F3 and forming the resonator 10 having the vibration arm 135; and arranging the upper lid 30 so as to face the lower lid 20 with the resonator 10 interposed therebetween. Moreover, the method further includes adjusting the frequency of the resonator 10 before or after the arranging the upper lid 30 by exciting the vibration arm 135 by applying the voltage between the metal layer E1 and the metal layer E2 and by causing a part of the vibration arm 135 to collide with at least one of the lower lid 20 and the upper lid 30. In the resonance device manufacturing method according to the present embodiment, by causing the vibration arm 135 to be over-excited and collide with the lower lid 20 and the upper lid 30, a part of the vibration arm 135 can be scraped off. With this, the resonant frequency can be adjusted even after the packaging. As a result, since there is no processing step in which a heat load or a stress load is applied after the frequency adjustment step, it is possible to prevent frequency variation from occurring. Further, since the adjustment can be performed while measuring the resonant frequency, the desired frequency can be obtained with ease.

Additionally, it is also preferable that the adjusting be performed after the disposing the upper lid 30, and include the causing the part of the vibration arm 135 to collide with at least one of the lower lid 20 and the upper lid 30. In this case, it is possible to adjust the resonant frequency using the surface or the rear surface of the vibration arm 135.

In addition, it is preferable that a region corresponding to the position where the displacement due to the vibration of the vibration arm 135 is maximized of the surface of the upper lid 30 or the lower lid 20 facing the resonator 10 be made of a material having hardness equal to or higher than the hardness of the vibration arm 135.

Further, it is also preferable that the forming of the resonator 10 include forming the protective film 235 and the adjustment film 236 having the larger mass reduction rate of etching than the mass reduction rate of the protective film 235 further on the surface of the metal layer E2 in order, and exposing the protective film 235 by removing the adjustment film 236 in the first region in the vibration arm 135 and leaving the adjustment film 236 in the second region, which is a region other than the first region in the vibration arm 135, having the lager displacement due to the vibration than the displacement in the first region, and the adjusting include scraping the adjustment film 236 left in the second region in the vibration arm 135 by causing to collide with the upper lid 30. With this, the variation in frequency can be suppressed among the plurality of resonance devices 1 manufactured on the same wafer.

Further, it is also preferable that the adjusting include measuring a resonant frequency of the resonator 10 and stopping a voltage equal to or larger than a predetermined value from being applied between the metal layer E1 and the metal layer E2 when the resonant frequency reaches a predetermined value. This makes it easier to obtain a desired frequency.

Each of the exemplary embodiments described above is to facilitate understanding of the present invention, and is not intended to limit the interpretation on the present invention. The present invention can be modified/improved without departing from the essential spirit thereof, and the equivalents are also included in the present invention. In other words, design changes added as desired to each of the embodiments by those skilled in the art also fall within the scope of the present invention as long as the features of the present invention are provided. For example, the elements provided in the embodiments, and the arrangements, materials, conditions, shapes, sizes, and the like thereof, are not limited to the examples given here, and can be changed as desired. It goes without saying that the above embodiments are merely examples and that configurations described in different embodiments can partly replace each other or be combined as well, and such configurations are also included in the scope of the present invention as long as they have the features of the present invention.

REFERENCE SIGNS LIST

1 RESONANCE DEVICE
10 RESONATOR
30 UPPER LID
20 LOWER LID
140 HOLDING PORTION
140a to d FRAME BODY
110 HOLDING ARM
120 VIBRATION PORTION
130 BASE PORTION
135A to D VIBRATION ARM
F2 Si SUBSTRATE
F21 SILICON OXIDE LAYER (TEMPERATURE CHARACTERISTICS CORRECTION LAYER)
235 PROTECTIVE FILM
236 ADJUSTMENT FILM

The invention claimed is:

1. A method for adjusting a resonant frequency of a resonance device that includes upper and lower lids with a resonator disposed therebetween that includes at least one vibration arm including a first electrode layer, a piezoelectric film and a second electrode layer, the method comprising:
   measuring a resonant frequency of a resonator; and
   when the measured resonant frequency is less than a frequency threshold, adjusting a frequency of the resonator by applying a voltage between the first electrode layer and the second electrode layer to excite the at least one vibration arm, such that the at least one vibration arm collides with at least one of the upper and lower lids, thereby scraping a material off the at least one vibration arm.

2. The method according to claim 1, further comprising:
   forming a first adjustment film on the second electrode layer;
   forming a second adjustment film on the first adjustment film, with the second adjustment film having a larger mass reduction rate of etching than a mass reduction rate of the first adjustment film; and
   exposing the first adjustment film by removing the second adjustment film in a first region of the at least one vibration arm.

3. The method according to claim 2, further comprising leaving the second adjustment film in a second region different from the first region of the at least one vibration arm, with the second region having larger displacement due to vibration than a displacement of the first region.

4. The resonance device manufacturing method according to claim 3, wherein the adjusting of the frequency comprises scraping the second adjustment film in the second region of the at least one vibration arm by causing the at least one vibration arm to collide with an upper lid of the upper and lower lids.

5. The resonance device manufacturing method according to claim 1, wherein the adjusting of the frequency of the resonator comprises applying the voltage between the first and second electrode layers such that the at least one vibration arm vibrates at an amplitude that is equal to or more than 10 times a normal amplitude during operation of the resonator.

* * * * *